United States Patent
Acimovic et al.

(10) Patent No.: US 6,246,738 B1
(45) Date of Patent: Jun. 12, 2001

(54) PHASE MODULATED REDUCTION OF CLOCK WANDER IN SYNCHRONOUS WIDE AREA NETWORKS

(75) Inventors: Predrag Acimovic, Burnaby; Charles Kevin Huscroft, Port Moody, both of (CA)

(73) Assignee: PMC-Sierra Ltd., Burnaby (CA)

( * ) Notice: Subject to any disclaimer, the term of this patent is extended or adjusted under 35 U.S.C. 154(b) by 0 days.

(21) Appl. No.: 09/196,621

(22) Filed: Nov. 19, 1998

(51) Int. Cl.[7] ............... H03D 3/24; H03D 3/02; H03L 7/06
(52) U.S. Cl. .......... 375/375; 375/376; 327/156; 327/147; 329/325
(58) Field of Search .................... 375/375, 376, 375/371, 373, 374, 327; 327/147, 156, 149, 141, 153, 160, 164; 329/325

(56) References Cited

U.S. PATENT DOCUMENTS

| | | | |
|---|---|---|---|
| 5,019,786 | * 5/1991 | Fairley et al. | 324/76.77 |
| 5,036,294 | 7/1991 | McCaslin | 331/1 A |
| 5,077,529 | 12/1991 | Ghoshal et al. | 327/152 |
| 5,373,255 | * 12/1994 | Bray et al. | 331/1 A |
| 5,475,718 | 12/1995 | Rosenkranz | 375/376 |
| 5,521,947 | * 5/1996 | Madsen | 375/375 |
| 5,604,773 | 2/1997 | Urala | 327/147 |
| 5,659,587 | * 8/1997 | Knierim | 375/376 |
| 5,726,607 | 3/1998 | Brede et al. | 331/2 |
| 6,087,868 | * 7/2000 | Millar | 327/156 |
| 6,125,158 | * 9/2000 | Carson et al. | 375/376 |

* cited by examiner

Primary Examiner—Chi Pham
Assistant Examiner—Khai Tran
(74) Attorney, Agent, or Firm—Oyen Wiggs Green & Mutala

(57) ABSTRACT

A phase detector for controlling a phase locked loop having a voltage controlled oscillator. A counter is clocked by a clock signal produced by the voltage controlled oscillator. A latch coupled to the counter is clocked by a modulated clock signal to latch values output by the counter. The modulated clock signal is produced by a phase modulator which modulates a synchronization clock reference signal. An accumulator coupled to the latch and clocked by the modulated clock signal receives and averages the latch values to produce a phase error signal representative of phase difference between the voltage controlled oscillator clock signal and the synchronization clock reference signal. The phase error signal is coupled to the voltage controlled oscillator to reduce the phase difference. The phase modulator modulates a rising edge of the synchronization clock reference signal with a modulation signal having modulation frequencies outside the loop bandwidth of the phase locked loop. The modulation signal is a discrete step signal having a fine time resolution which causes the latch to latch different values output by the counter in different time intervals corresponding to the time of occurrence of the modulated clock signal's rising edge with respect to the respective time intervals.

14 Claims, 13 Drawing Sheets

PHASE MODULATED REDUCTION OF CLOCK WANDER IN SYNCHRONOUS WIDE AREA NETWORKS

TECHNICAL FIELD

This application pertains to a phase detector which controls a phase locked loop by modulating a synchronization clock reference signal with a modulation signal having modulation frequencies outside the narrow loop bandwidth of the phase locked loop to provide very fine interval resolution and minimize clock wander.

BACKGROUND

The phenomenon of "clock wander" in synchronous wide area networks (WAN) can cause errors in transmission of digital signals over such networks. Error-free signal transmission over such networks requires that data enter a network node at the same rate as data emerges from the node. If this condition is not satisfied at all network nodes by implementation of an appropriate network synchronization scheme, then some data can be lost.

In the prior art, network synchronization has been implemented by means of "building integrated timing supply" (BITS) clocks, or by Digital Signal 1 ("DS1", formerly "T1") signals consisting of framed all ones. As specified in ITU-T G.703, DS1 signals comprise a 1.544 Mbps time division multiplexed bit stream. More recently, Optical Carrier level N ("OC-N") signals have been used synchronize multiple WAN clocks. OC-N signals are optical signals, with "N" being a multiplier (i.e. N=1, 3, 12, 48, 192, . . . ) applied to a basic 51.84 Mbps optical signal. Ideally, all network clocks are synchronized to a primary reference source (PRS). This is typically achieved via phase locked loop (PLL) methodology.

The performance characteristics of frequency locked loop (FLL) methodologies are relatively poor in comparison to those of PLL methodologies. FLLs use a frequency discriminator to detect loop lock, with a feedback signal being provided to maintain loop lock. The frequency discriminator output level is sufficiently high at higher frequency offsets, but at lower frequency offsets the output level can be so low that it will not suffice to maintain proper loop lock, resulting in "wander" of the synchronization frequency produced by the FLL. For example, the frequency offsets between different network clocks are typically a fraction of 1 Hertz, so a frequency discriminator produces no practically useful output. Phase detectors and PLLs are accordingly preferred in network synchronization methodologies.

Synchronization quality can be defined in accordance with any one of several national or international telecommunication or organizational specifications, such as Bellcore, ITU-T, ANSI, etc. The "wander generation" and "wander transfer" parameters of a clock are defined in terms of "maximum time interval error" (MTIE) and "timing deviation" (TDEV), as will now be explained.

"Wander generation" is a measurement used to quantify the amount of "wander" generated by a clock synchronization circuit. It is well known that digital clocks exhibit pulse position modulation errors. That is, the edges of clock pulse signals output by digital clocks deviate from the ideal clock edge positions. The term "jitter" is used to describe short term signal variations, such as pulse position modulation frequencies which exceed 10 Hz. The term "wander" is used to describe longer term variations of significant digital signal properties (e.g., zero level crossings) from their ideal positions in time, and is applied to pulse position modulation frequencies below 10 Hz. Jitter is typically attributable to additive Gaussian noise, whereas wander is typically attributable to slowly varying environmental conditions.

A variety of different sources can introduce low frequency modulation resulting in wander. These include changes in operating temperature and $1/f$ noise. An oscillator locked to a wander-free reference clock in a narrow bandwidth PLL will exhibit wander above the frequencies at which the open loop gain is below 0 dB. In digital network synchronization, very narrow bandwidth (below 0.1 Hz) PLLs are used to filter accumulated wander from the PRS to generate a timing reference signal. Such clocks must satisfy short term stability requirements and limit the amount of wander which they generate. For example, the Bellcore and ANSI standards stratify clocks according to their long term stability, and limit their short term stability.

"Wander transfer" is a measurement used to quantify the amount of wander that is transferred from a "wandering" input reference to an outgoing OC-N signal. The synchronization reference circuit containing the PLL should filter wander above 0.3 Hz according to the ITU-T G.813 standard.

Optical signal telecommunication systems are characterized by various sources of wander besides those mentioned above. For example, changes in operating temperature cause wander by varying the light propagation characteristics of the optical signal-carrying fiber. A light pulse propagates through a long fiber with a given velocity. If the fiber's index of refraction changes due to temperature variation, the signal propagation velocity through the fiber is also changed. This is mathematically equivalent to a change in the physical length of the fiber (i.e. as though the distance between the signal transmitter and receiver had changed, relative to the transmitter-receiver distance at a different fiber temperature). Consequently, data transmitted into one end of the fiber at one frequency is received at the opposite end of the fiber at a different frequency. The output frequency of the laser which produces the optical signal is also temperature dependent. Further, the propagation delay of light pulses transmitted through the fiber varies as a function of signal wavelength, producing a further frequency differential effect.

As previously explained, jitter is defined in terms of frequencies exceeding 10 Hz, whereas wander is defined in terms of frequencies below 10 Hz. Consequently, jitter and wander are specified in different ways. Jitter is specified in terms of UI (unit interval) RMS or Peak-to-Peak values, but may also be specified in units of time (e.g. nanoseconds) or phase (e.g. degrees). Wander is specified in terms of maximum time interval error (MTIE) and time deviation (TDEV).

MTIE describes the frequency offset of a clock from its ideal frequency, and the phase changes of the clock, over an "observation" period. MTIE is specified in units of nanoseconds of peak-to-peak wander. TDEV describes the spectral content of the clock and is specified in units of RMS nanoseconds of wander.

In order to determine the MTIE and TDEV parameters of a clock, one must measure the clock's time interval error (TIE). TIE is the time difference between an ideal clock and the observed clock, as will now be explained with reference to FIG. 1 in which $\Delta\tau 1$, $\Delta\tau 2$, . . . represent TIE.

The observation time interval, $\tau$, can be set to any convenient value (it is independent of clock frequency). At the end of the observation time interval a measure is made of how much the observed imperfect clock has deviated from the ideal clock (the phase difference). Longer observation times should produce larger values of $\Delta\tau$. The MTIE for a particular observation interval is simply the maximum TIE that results from an infinite number of TIE measurements, each performed after particular observation intervals.

By definition, the maximum wander frequency is 10 Hz, so it is possible to completely describe the wander signal up to 10 Hz if the TIE is sampled at twice this rate (the Nyquist rate of 20 Hz; although a higher rate is preferably used to avoid any aliasing). The TIE can be measured and recorded at 50 ms intervals, then by setting different "sliding windows" equal to different observation intervals, the maximum TIE values can be determined by grouping the measured values into the sliding windows. A constant frequency offset will produce the same MTIE value for a given observation period; MTIE will increase linearly with increasing observation time. MTIE is a good metric of frequency offsets between an observed clock and an ideal clock, and also provides a record of any phase transients (i.e. one-shot phase jumps).

MTIE does not reveal how "noisy" the observed clock signal is. The TDEV measurement is used to represent the spectral components of the observed clock. To measure TDEV the same TIE measurements previously collected at 50 ms or faster are used, and digital signal processing (DSP) filtering techniques are applied to quantify the spectral components. As shown in FIG. 2, DSP filtration blocks DC, so frequency offsets are not included in the measurement. Any phase transients that may occur do so rarely and any resulting energy from these transients tends to average out over a large number of samples having the same integration interval values.

Synchronous network clocks are classified according to different "strata". For example, the network master clock is known as the Primary Reference Source (PRS) is classified as Stratum 1. The following table lists the clock stratum of a typical synchronous network.

| Clock stratum | Typical location(s) |
| --- | --- |
| 1 | Primary Reference Source |
| 2 | Class 4 toll office |
| 3 | Class 5 end office |
| 4 | Channel bank, end user multiplexer |

The aforementioned specifications require that a stratified clock have MTIE and TDEV values below predefined masks when the clock is locked to a reference clock. Values of TDEV and MTIE are measured against the reference clock. For example, in the context of the present invention, the aforementioned "masks" are specified by GR-253-CORE or ITU-T G.813 and set maximum allowed MTIE or TDEV for measurements made under specified conditions. A SONET NE optical or electrical output must meet the MTIE and TDEV wander generation requirement masks depicted in FIGS. 3 and 4.

Conformance to this requirement is tested with a wander-free reference having bandlimited white noise phase modulations (jitter) of 1000 ns p—p.

The jitter is bandlimited with 3 dB cut-off frequencies at 10 Hz and 150 Hz. This specification tests the short term stability of the clock source.

The MTIE wander generation specification limits both the frequency offset and phase transient characteristics of the locked clock with respect to the reference clock at all times. The TDEV wander generation specification limits the phase noise of the locked clock for very low frequencies. The wander transfer specification requires that a stratified clock filter out any wander of the reference clock signal above a particular frequency offset, which is typically measured fractions of 1 Hertz. Moreover, the wander transfer specification limits the bandwidth of a phase lock loop to an exceptionally narrow PLL loop bandwidth. Consequently, the PLL's VCXO must have very high free running stability and very good phase noise characteristics (i.e. in order to yield MTIE measurements below FIG. 3 MTIE mask for observation times below 4 sec and TDEV measurements below the FIG. 4 TDEV mask for integration times below 4 sec). It is difficult to reliably satisfy the wander generation and wander transfer specifications using conventional PLL components such as phase detectors and loop filters, primarily because such components are subject to imprecise VCXO control characteristics.

Analog phase detectors can be used, but they tend to be very sensitive to temperature fluctuations. Furthermore, compliance with the aforementioned specifications requires that the synchronization circuitry provide a holdover in the case of an input signal failure ("holdover" is a mode of PLL operation in which last frequency before entry into the holdover mode is maintained). Typically, the synchronization circuitry provides the holdover by storing information about the last good known reference frequency as a digital value. Generally, the information in question is more precisely stored in digital form, as opposed to storage in analog form in a sample and hold circuit, because the information may need to be stored for intervals exceeding 24 hours in accordance with Bellcore GR-253-CORE, Dec. 2, 1995, Issue 2.

If the value representing the last known reference frequency is stored in digital form, with the synchronization circuitry using an analog phase detector, then one must convert the analog voltage output of the phase detector to digital form. This requires an analog-to-digital converter (ADC). It can thus be seen that if an analog phase detector is used, the synchronization circuitry requires two additional analog circuits, both of which are susceptible to temperature fluctuations. The bandwidth of the synchronization circuitry is very narrow, namely less than 1 Hertz in order to filter wander on the incoming reference clock signal, according to the aforementioned specifications. Temperature fluctuations can cause variations in the transfer characteristics of the phase detector, ADC, and DAC. The PLL's narrow bandwidth response characteristics may not be fast enough to compensate for variations in transfer characteristics of the phase detector and ADC, resulting in wander. To avoid such wander, it is preferable to minimize the use of analog circuitry susceptible to temperature fluctuations, and instead use a phase detector having a digital output.

One example of a prior art phase detector capable of producing the desired digital output is a counter with a latch (FIG. 6). Such phase detector circuits typically consist of an N-length counter clocked by the VCXO frequency, as depicted in FIG. 6. Usually, the VCXO frequency of a simple PLL like that depicted in FIG. 5 is a multiple of the reference clock frequency. But, the clock signals compared by the phase detector must have the same (or very close) frequencies. A Divide-by-M circuit is accordingly provided in the feedback path of the FIG. 5 PLL to divide the VCXO frequency down to be the same as a reference clock frequency. The FIG. 6 modified phase detector does not require the synchronization reference and VCXO clock signals to have the same frequency, so a Divide-by-M circuit is not necessary. The counter shown in the FIG. 6 circuit can be designed to have a period equal to period of the synchronization reference signal, thus providing function equivalence to the Divide-by-M circuit of FIG. 5.

The FIG. 6 phase detector produces a digital output value proportional to the phase difference between the VCXO frequency and the synchronization reference frequency. Although it not as sensitive to temperature variations as an analog phase detector, the FIG. 6 phase detector nevertheless has a serious drawback. Specifically, the FIG. 6 phase detector can not distinguish finer phase increments than those defined by the VCXO time intervals. Therefore, this type of phase detector exhibits a so-called "dead band": the phase of the synchronization reference can vary within one VCXO timing interval without being detected. Similarly, the phase of the VCXO can vary within one VCXO timing interval without producing a change in the phase detector's output value. If the VCXO timing interval is of the same order as the allowances permitted by the MTIE and TDEV specifications, then the synchronization PLL may create more wander than the specifications permit. A higher VCXO frequency can be used to reduce the dead band, but this requires an additional PLL to multiply the VCXO frequency several times.

The present invention addresses the aforementioned digital phase detector dead band wander generation problem. The value of the counter is sampled at certain reference instances and used to control the frequency of the VCXO. The invention provides a method which is superior in performance and more robust than the analog phase detector method, is more efficient than standard techniques for increasing clock frequency, and meets the wander and jitter related specifications of Bellcore GR-253-CORE and ITU-T G.813.

SUMMARY OF INVENTION

The invention provides a phase detector for use in a phase locked loop (PLL) having a voltage controlled oscillator (VCXO). The phase detector includes a counter clocked by a clock signal produced by the VCXO. A latch is coupled to the counter and clocked by a modulated clock signal to latch values output by the counter. A phase modulator modulates a synchronization clock reference signal to produce the modulated clock signal. An accumulator is coupled to the latch and clocked by the modulated clock signal to receive and average the latch values. The accumulator produces a phase error signal representative of phase difference between the VCXO clock signal and the synchronization clock reference signal. The phase error signal coupled to the VCXO to reduce the phase difference.

The phase modulator modulates a rising edge of the synchronization clock reference signal. The modulation frequencies of the modulation signal are outside the loop bandwidth of the PLL. The modulation signal can be a discrete step signal having a fine time resolution. This causes the latch to latch different values output by the counter in different time intervals corresponding to the time of occurrence of the modulated rising edge with respect to the respective time intervals.

DESCRIPTION

Figure 1:
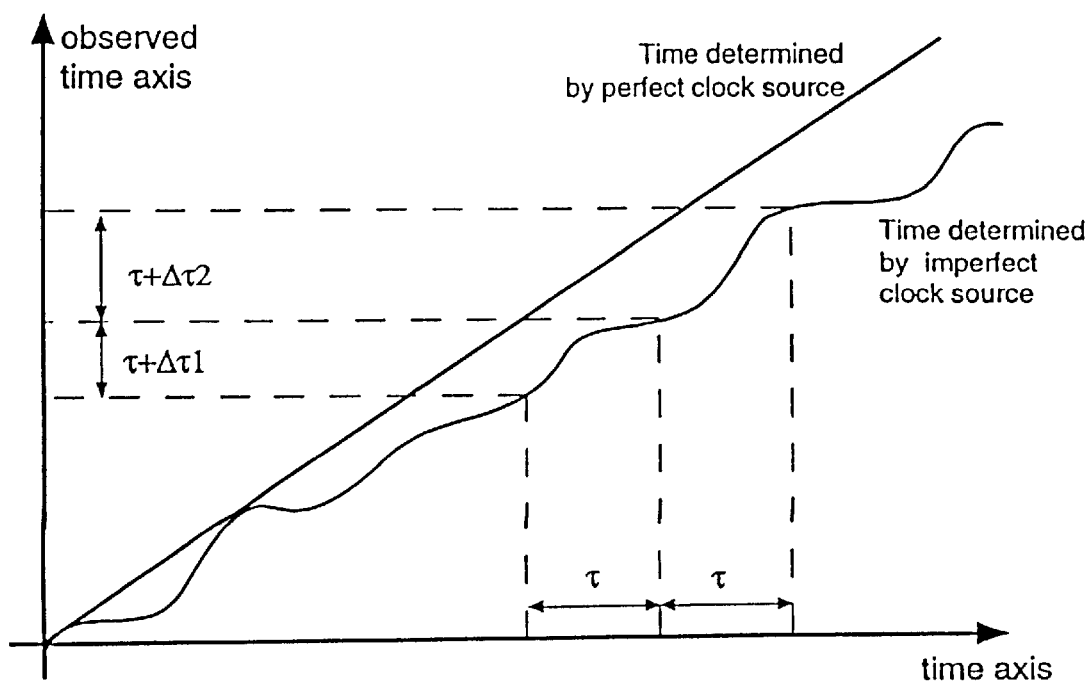
FIG. 1 is a (prior art) graphical depiction of the time interval error (TIE) of an observed clock (ordinate values) relative to an ideal clock (abscissa values).
Figure 2:
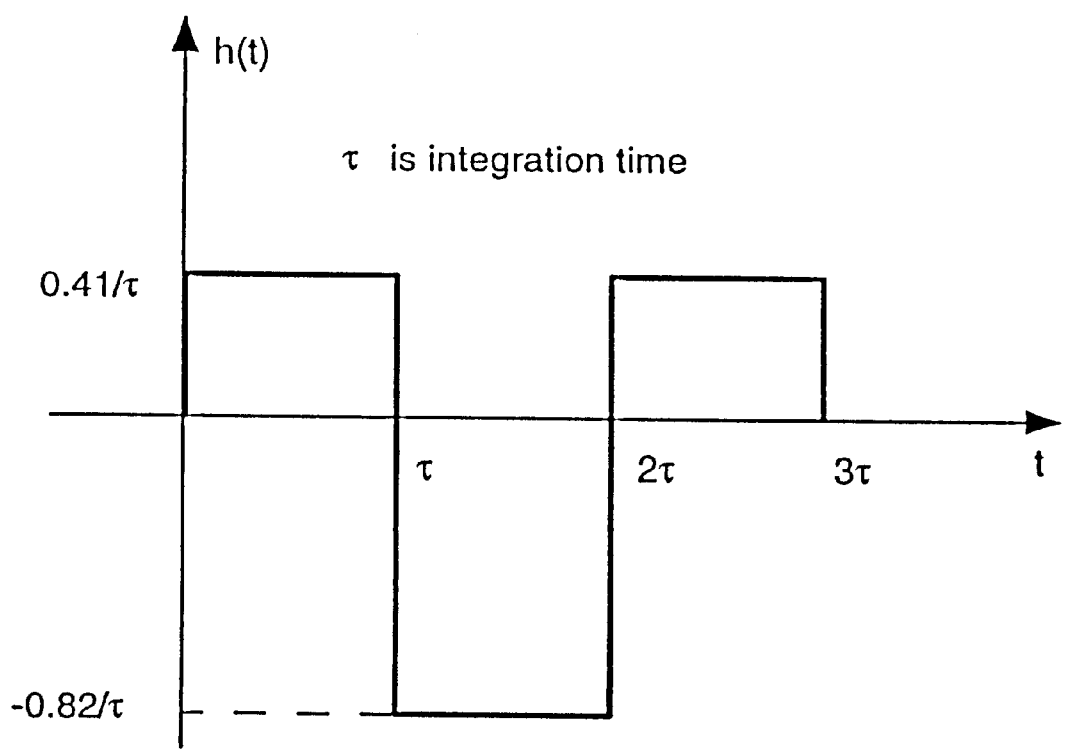
FIG. 2 is a graphical representation of the impulse response of a prior art digital signal processor (DSP) timing deviation (TDEV) filter.
Figure 3:
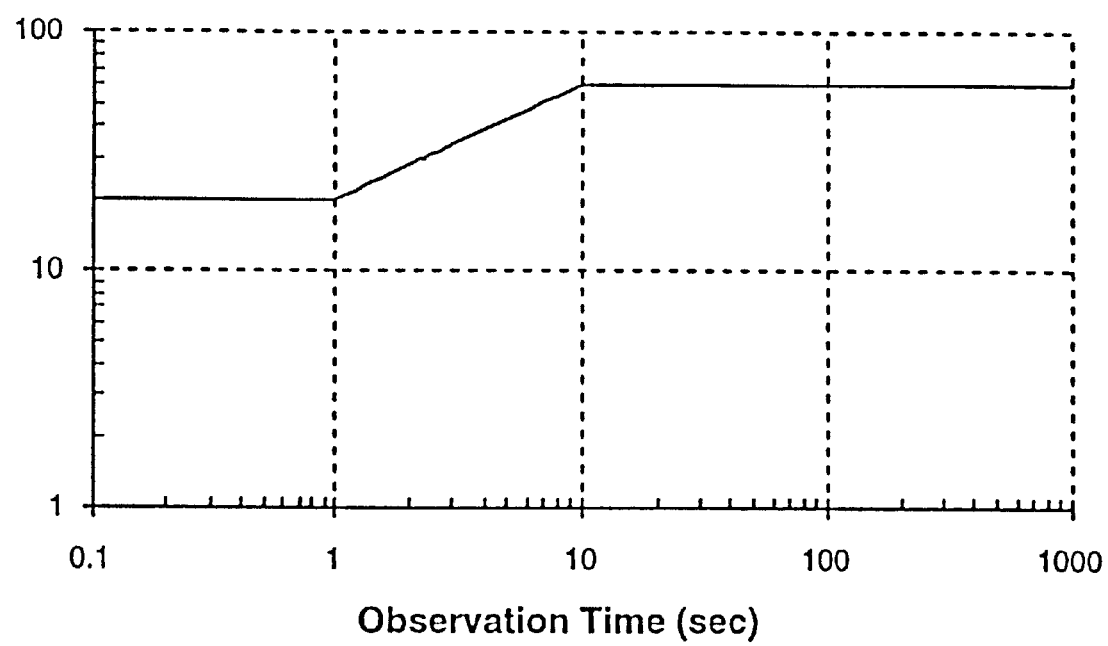
FIG. 3 is a (prior art) graphical depiction of a maximum time interval error (MTIE) wander generation requirement mask, plotted as a function of observation time in seconds.
Figure 4:
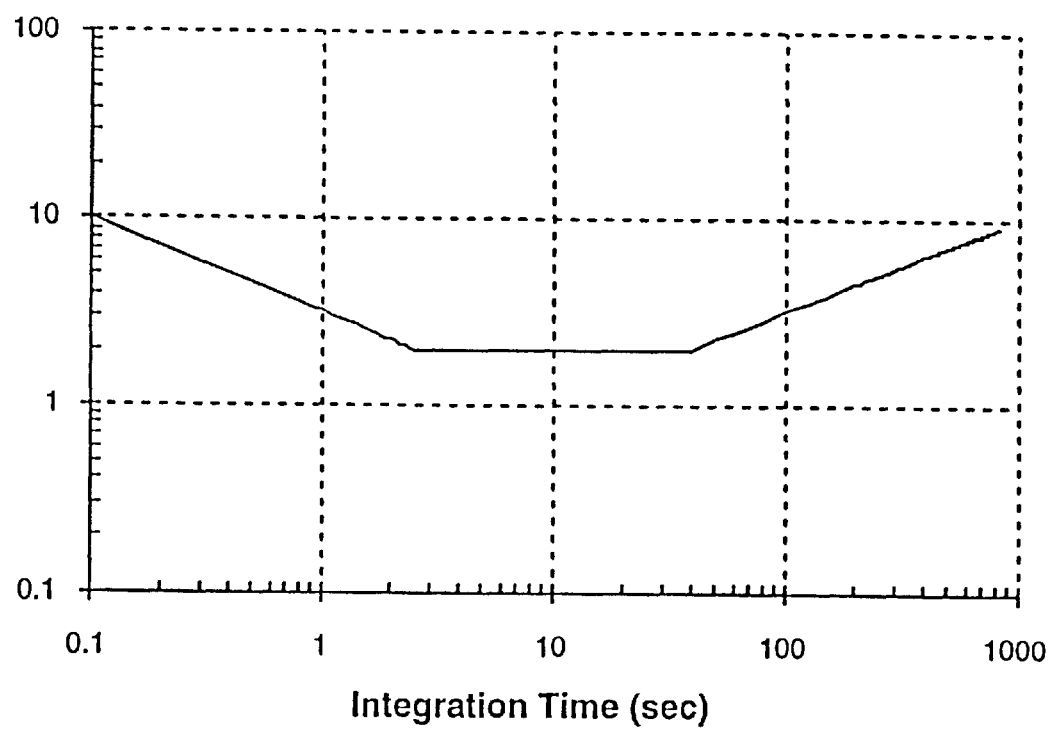
FIG. 4 is a (prior art) graphical depiction of a TDEV wander generation requirement mask, plotted as a function of integration time in seconds.
Figure 5:
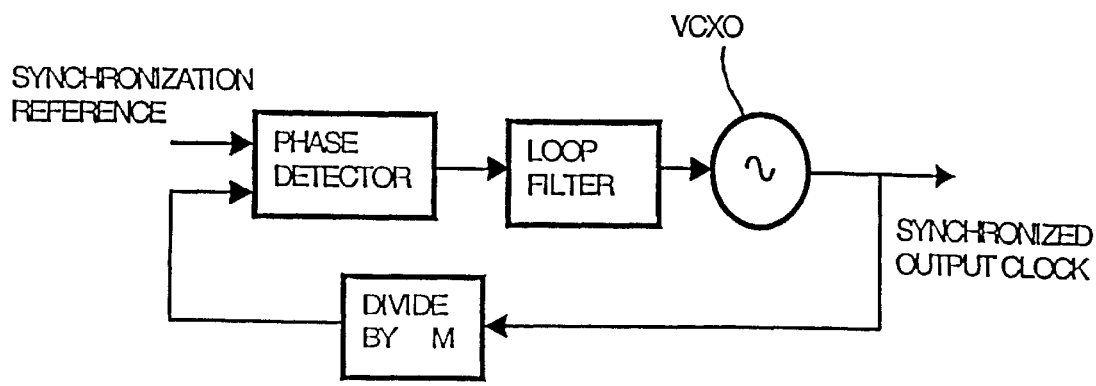
FIG. 5 is block diagram representation of a prior art PLL based synchronization circuit.

The invention will be described in the context of a phase locked loop (PLL) for synchronization of digital synchronous networks. The PLL consists of a novel phase detector (FIG. 7), a VCXO and a loop filter. The VCXO and loop filter are not shown in FIG. 7 but they are identical to the FIG. 5 VCXO and loop filter respectively.

Figure 7:
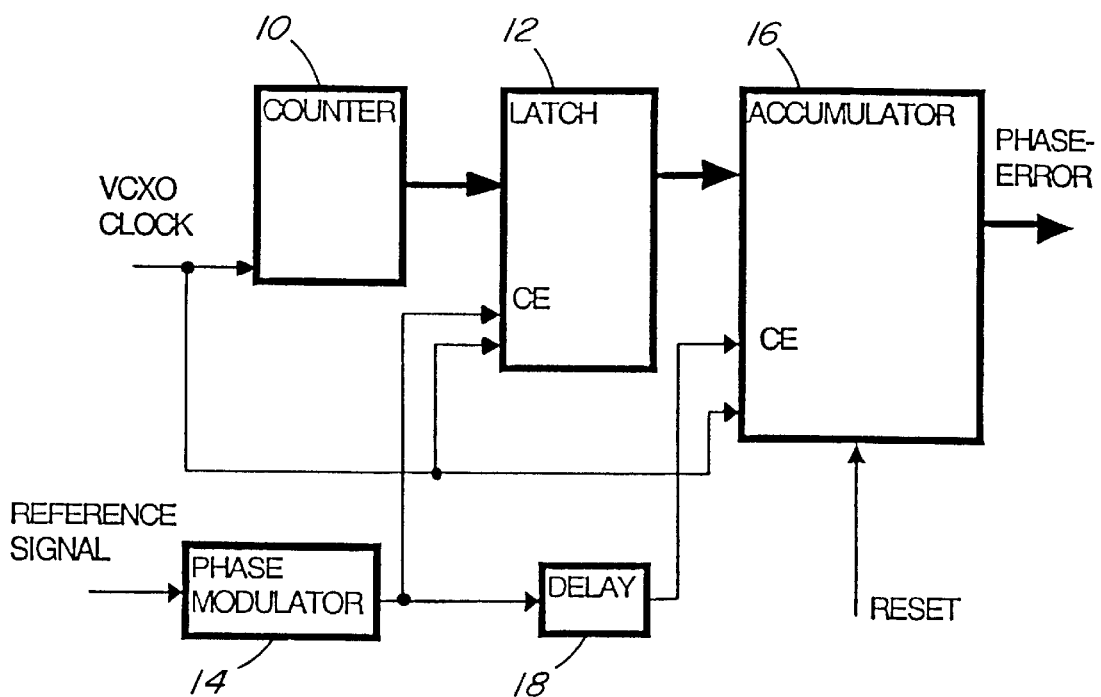
FIG. 7 is block diagram representation of a counter-based phase detector in accordance with the present invention.

As shown in FIG. 7, the phase detector incorporates a counter 10 which is clocked by the VCXO frequency, and a latch 12 which latches the value output by counter 10 on the rising edge of a suitably modulated version of the synchronization clock's reference signal. As hereinafter explained, digital phase modulator 14 modulates the reference signal with a modulation signal whose modulation frequencies are outside the loop bandwidth of the PLL, thus providing very fine interval resolution, simulating the effect of a counter clocked at much higher frequencies. The latched values are averaged in accumulator 16, which is also clocked by the rising edge of the modulated clock reference signal (suitably delayed by delay element 18), and which outputs the resultant phase error signal. The FIG. 7 phase detector achieves better phase detection than prior art phase detectors utilizing counters clocked at much higher VCXO frequencies.

Figure 6:
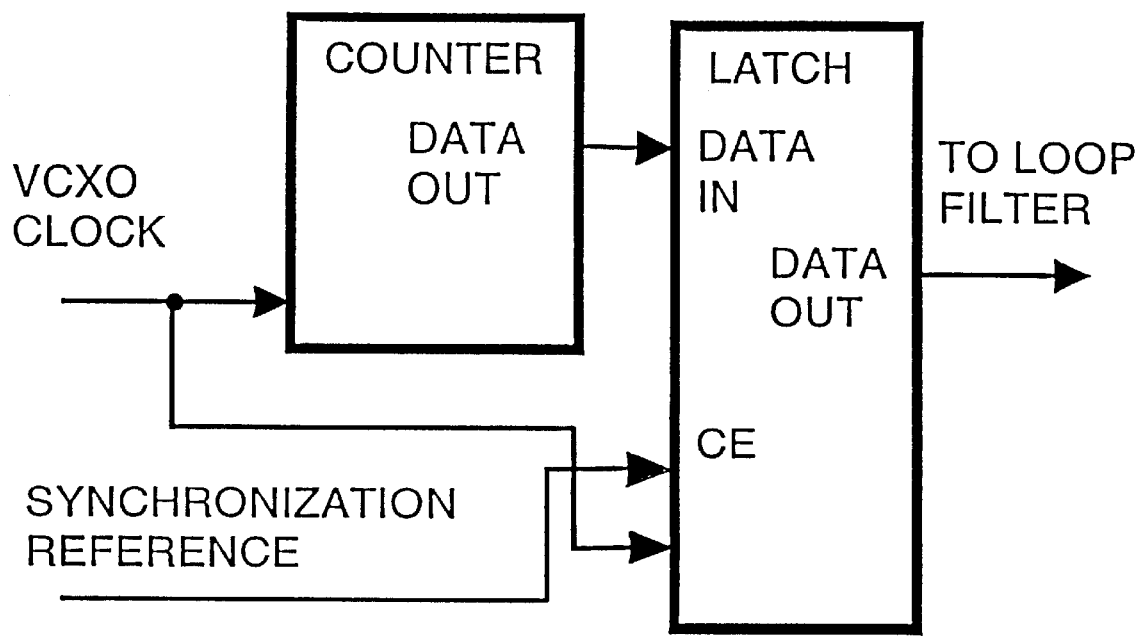
FIG. 6 is block diagram representation of a prior art phase detector incorporating a counter and a latch.

The improved performance of the FIG. 7 phase detector becomes apparent when the synchronization clock's reference signal wanders slowly within a single count value of counter 10. The latched value output by the prior art phase detector of FIG. 6 is insensitive to such wandering; the latch is simply clocked by the rising edge of the synchronization clock's reference signal. Accordingly, the VCXO frequency cannot be controlled accurately by the prior art phase detector of FIG. 6. But, in the FIG. 7 phase detector, phase modulator 14 modulates the rising edge of the synchronization clock's reference signal with a very fine discrete step signal. Such modulation causes latch 12 to output different latched values over particular time intervals. These output values are averaged by accumulator 16. The averaged value output by accumulator 16 represents the true average frequency, facilitating much better control of the VCXO frequency, without added wander.

Figure 8:
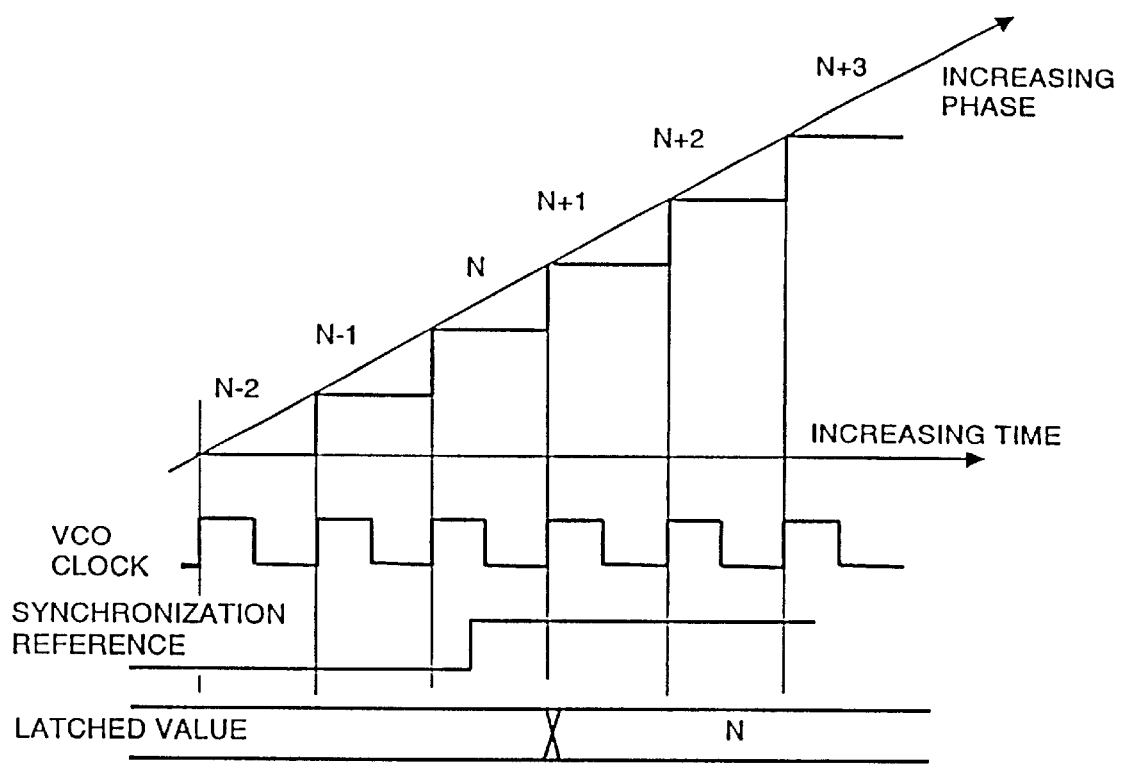
FIG. 8 is a functional timing diagram for a counter-based phase detector in accordance with the present invention.

FIG. 8 is a functional timing diagram for the FIG. 7 counter-based phase detector. The "latched value" output by latch 12 will be N if the rising edge of the synchronization clock's reference signal occurs anywhere during the interval within which the counter's output value is N. However, phase modulator 14 modulates the rising edge of the synchronization clock's reference signal, such that the rising edge may occur during an interval within which the counter's output value is different than N, thus enabling different output values to be latched by the rising edge of the synchronization clock's reference signal. For example, suppose that over an interval during which a total of X latched values are averaged by accumulator 16, Y instances of latched value=N+1 are observed and X-Y instances of latched value=N are observed. The average latched value output by accumulator 16 in this situation is:

$$Average\_value = \frac{(X-Y)*N + Y*(N-1)}{Y} \quad (1)$$
$$= \frac{X*N - Y*N + Y*N - Y}{X}$$
$$= N + \frac{Y}{X}$$

In this example, the output value N is modified by the ratio Y/X. X depends on the number of the averages taken, while Y depends on the modulation signal value. This modulation signal should repeat during every accumulation period so that accumulator 16 will produce the same average value even if the rising edge of the synchronization clock's reference signal is invariable with respect to the rising edge of the VCXO signal. A pseudo random sequence generator can be used to produce an appropriate modulation signal, but a variety of alternative generators can be used to produce the modulation signal, as long as the modulation signal is cyclostationary with respect to the accumulation period. Note that the precision of the FIG. 7 phase detector is dependent upon the number of averages taken, not the clocking frequency of counter 10.

Thus, a more accurate lock can be achieved with a slower system clock, providing additional benefits such as reduced power consumption and reduced susceptibility to coupling of spurious signals (crosstalk, noise, etc.).

Figure 9:
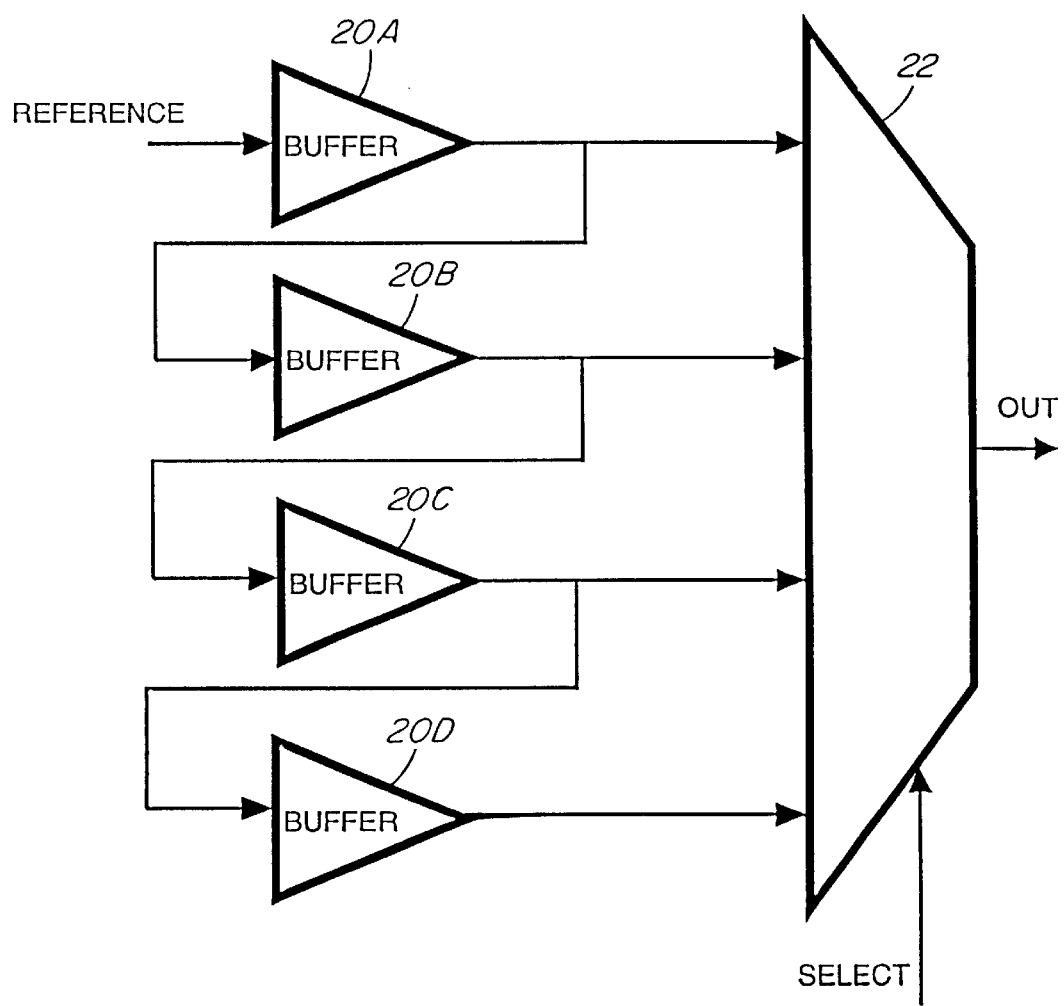
FIG. 9 is block diagram representation of one embodiment of the phase modulator portion of the FIG. 7 circuitry.

FIG. 9 depicts one possible implementation of phase modulator 14 in which the rising edge of the synchronization clock's reference signal is delayed through a number of cascaded buffers 20A, 20B, 20C, etc., each of which is coupled to a respective one of the inputs of multiplexer 22. The "select" signal selects the number of buffers used to delay the synchronization clock's reference signal during any particular interval. Many other implementations are possible.

Theory of Operation

Although not wishing to be bound by any theory, the inventor believes that those skilled in the art may be assisted in comprehending the invention by the following theoretical discussion.

Assume that the counter period and the synchronization reference signal period are equal. Furthermore, assume that the noise on the VCXO is so small that it will not influence the following discussion. Within one accumulation period, the VCXO will be held at constant frequency. During the same accumulation period, the rising edges of the synchronization reference signal will latch a number of counter values. The latched values are averaged during the accumulation period. The synchronization reference clock signal will have some noise superimposed. It can safely be assumed that the noise will have a Gaussian probability density function (pdf). Depending on the noise power, the rising edges of the clock signal will occur at different times relative to the rising edges of the VCXO clock signal, which is not influenced by noise. Assume that, in the absence of noise, the rising edge of the synchronization clock's reference signal would latch the counter value N but, due to the noise, a different value such as N+1 or N−1 is latched. Depending on the noise power and actual position of mean clock instance in respect to the VCXO signal, other latched values can occur. (In theory, the interval between successive rising edges of the synchronization reference signal is constant. But, in practice, the interval varies due to unavoidable noise. The "mean clock instance" is the statistical mean of these intervals.)

Figure 10:
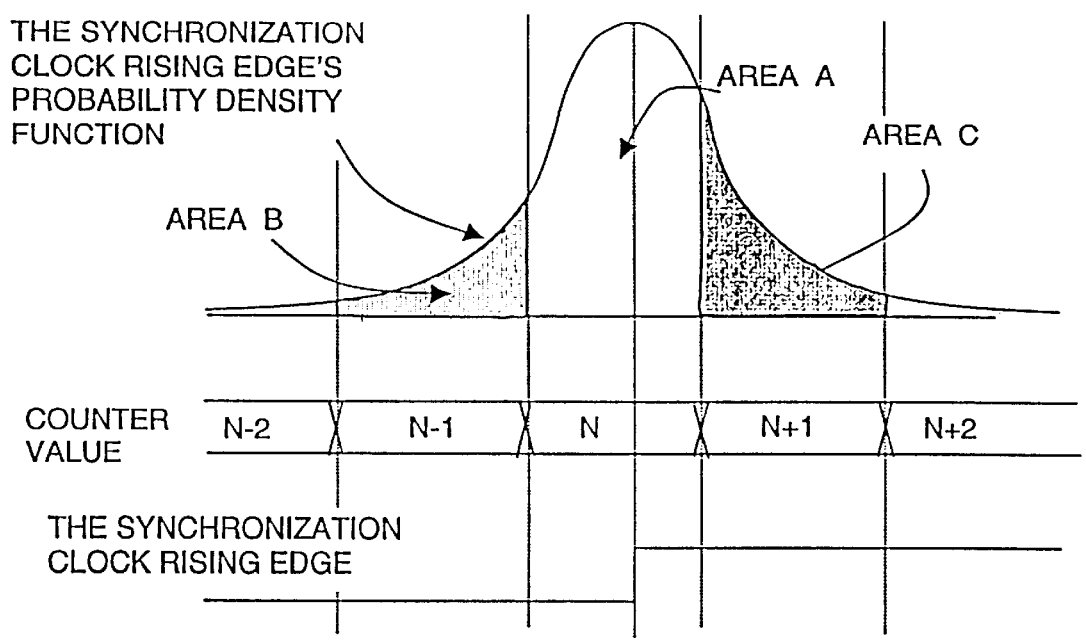
FIG. 10 is a graphical representation depicting counter values produced by the FIG. 7 circuitry as a function of Gaussian probability density function of reference clock signal rising edge instances.

FIG. 10 graphically depicts latched counter values (horizontal axis) with respect to reference clock rising edge instances pdf (vertical axis). The pdf function emulates the Gaussian probability density function f(x):

$$f(x) = \frac{1}{\sqrt{2\pi\sigma^2}} e^{-\frac{(x-m)^2}{2\sigma^2}} \quad (2)$$

Where $\sigma$ is the process standard deviation, m is the mean and x is the displacement in time from the mean occurrence of the rising edge of the synchronization reference signal. The mean of this process can be defined as an offset between the time at which the counter has some value N, and the most probable time of occurrence of a rising edge of the synchronization reference signal. The standard deviation a depends on the input signal to noise ratio (SNR), and on the loop transfer function of the clock recovery circuit. In most cases, the clock recovery circuit will consist of a second order non-linearity followed by the PLL, so the input SNR will be reduced by the PLL and the pdf of the synchronization reference signal will be modified from the original. At the input, data transition instances are modulated by white noise, a process that clearly has Gaussian pdf. Due to jitter tolerance requirements, the loop bandwidth of the clock recovery circuit is quite wide, so the input data transition pdf is maintained as rising edges of the synchronization reference signal. This is why a Gaussian pdf can be assumed for the rising edges of the synchronization reference signal. Further, the rising edge of the synchronization reference signal is a cyclostationary process during the accumulation period if the VCXO is locked to the reference clock. This facilitates the following statistical analysis.

The probability that the latched value will be N−1 is proportional to the size of "area B" under the pdf curve shown in FIG. 10. Similarly, the probability that the latched value will be N is proportional to the size of "area A"; and, the probability that the latched value will be N+1 is proportional to the size of "area C". Depending on the standard deviation $\sigma$ versus the counter clock interval T, other values can be latched with some reduced probability.

The probability that a value N−1 will be latched can be calculated. This probability is equal to the difference between the probability ($PL_{n-1}$) that no value larger than N−1 will be latched and the probability ($PP_{n-1}$) that no smaller value (i.e. N−2, N−3, . . . ) will be latched.

$$PP_{n-1} = \int_{-\infty}^{-(T+m)} \frac{e^{-\frac{(t-m)^2}{2\sigma^2}}}{\sqrt{2}\sigma} dt \qquad (3)$$

By substituting $(t-m)/\sqrt{2}\sigma=u$ in equation 3 we get:

$$PP_{n-1} = \frac{1}{2} \text{erfc}\left(\frac{T+m}{\sqrt{2}\sigma}\right) \qquad (4)$$

Similarly, substituting into equation 4 we get:

$$PL_{n-1} = \int_{-\infty}^{-m} \frac{e^{-\frac{(t-m)^2}{2\sigma^2}}}{\sqrt{2}\sigma} dt \qquad (5)$$

$$PL_{n-1} = \frac{1}{2} \text{erfc}\left(\frac{m}{\sqrt{2}\sigma}\right) \qquad (6)$$

Therefore the probability that the latched value is N−1 is:

$$P_{n-1} = (PL_{n-1}) - (PP_{n-1}) = \frac{1}{2}\left[\text{erfc}\left(\frac{m}{\sqrt{2}\sigma}\right) - \text{erfc}\left(\frac{T+m}{\sqrt{2}\sigma}\right)\right] \qquad (7)$$

Next, calculate the probability that the latched value is N (i.e. area A in FIG. 10). This probability is 1 minus the probability that counter value N is not latched. The probability that counter value N is not latched is equal to the sum of the probability that some previous value is latched ($PP_n$, or area B in FIG. 10) and the probability that some later value is latched ($PL_n$, or area C in FIG. 10). Note that $PP_n=PL_{n-1}$.

$$PL_n = \int_{T-m}^{\infty} \frac{e^{-\frac{(t-m)^2}{2\sigma^2}}}{\sqrt{2}\sigma} dt \qquad (8)$$

$$PL_n = \frac{1}{2} \text{erfc}\left(\frac{T-m}{\sqrt{2}\sigma}\right) \qquad (9)$$

The probability that a latched value is $P_n$ is equal to one minus the probability that the latched value is less than N, minus the probability that the latched value is greater than N.

$$Pn = 1 - (PL_n) - (PP_n) = 1 - \frac{1}{2}\left[\text{erfc}\left(\frac{m}{\sqrt{2}\sigma}\right) - \text{erfc}\left(\frac{T-m}{\sqrt{2}\sigma}\right)\right] \qquad (10)$$

Finally, the transfer function of the phase detector can be obtained by summing all of the probabilities that the latched value will be some certain value x.

$$PDTF(m, \sigma) = \sum_{x=1}^{NMAX} X * P_x \qquad (11)$$

The phase detector transfer function PDTF as a function of signal to noise ratio ($\sigma$) and phase difference between the VCXO clock and synchronization reference signal (m) is on average the sum of the products of the counter values multiplied by the probability that a particular counter value will be latched.

Figure 11:
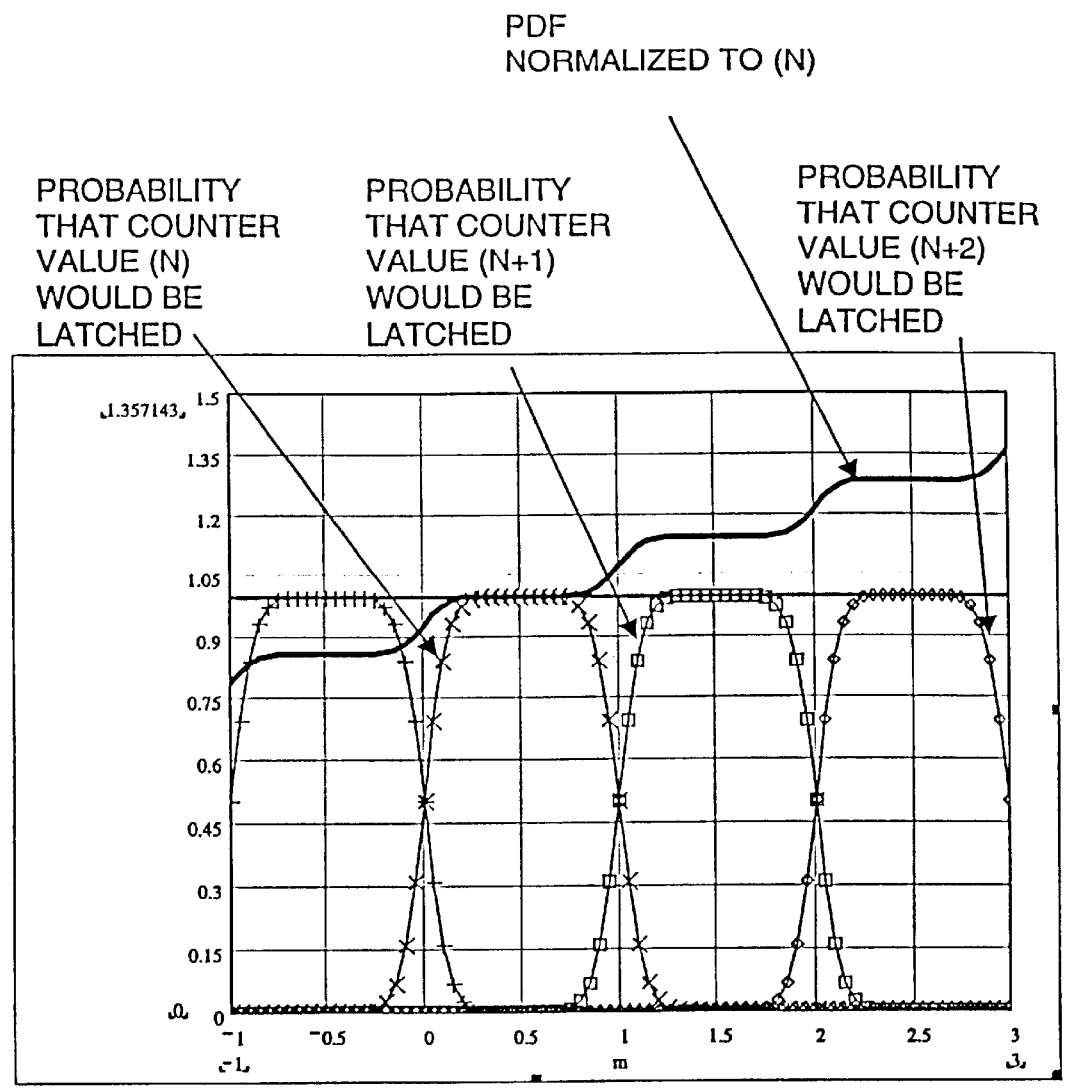
FIG. 11 is a graphical representation of a phase detector transfer function for the case σ=0.1.

This interesting result explains the behaviour of the FIG. 7 phase detector. First, notice that if no noise is present, $\sigma=0$, the complementary error functions are reduced to zero, and the value N is necessarily latched. The PDTF as a function of m exhibits a staircase characteristic, as seen in FIG. 11 which shows the normalized transfer function of the phase detector for a signal to noise ratio of 0.1. The staircase transfer function exhibits a dead band. More particularly, the FIG. 11 curve designated "PDF normalized to (N)" represents the probability of latching a value N. The curve is normalized to N for ease of illustration (i.e. N is the unit value of the ordinate). The curve resembles a staircase with rounded edges. The "flat" portions of the curve represent "dead band" regions in which a change in the abscissa value does not produce a change in the ordinate value. In other words, there are dead bands within which the phase detector is not able to detect a change in phase between the synchronization reference signal and the VCXO clock. If a large amount of noise is present, such that $\sigma>T$, the probability that some other value in the vicinity of N will be latched approaches the probability that the counter value N will be latched.

FIG. 11 also shows the phase detector's sensitivity as a function of m, the offset of the synchronization reference signal's rising edge with respect to each instance of the counter assuming a value=N. Because the complementary error function decreases rapidly with increasing argument value, it can be seen that the most sensitive position is when m=0 or any integer multiple of T. Sensitivity drops rapidly as m approaches the value m=T/2. The sensitivity is dependant on the standard deviation $\sigma$, so for small values of $\sigma$, the phase detector exhibits dead band zones with a period of T, the counter clock period.

As previously explained, the reference clock is pseudo randomly delayed before latching the counter value. The probability distribution of the delay is not important, as long as the probability of the specific delay is kept constant from one accumulation period to another (discrete delay values are assumed, but this theoretical discussion is also applicable to continuous delay values). An incremental delay value need not be constant. To demonstrate the phase detector's characteristic we derive the expression for the phase detector's sensitivity using four delay values: D0, D1, D2, D3. The total delay should cover at least one clock interval to avoid the dead band zone.

The probability that a value N−1 will be latched with no delay is as previously indicated, except it is multiplied by the probability that the synchronization reference signal's rising edge will not be delayed (p(ND)). The probability of latching the counter value N−1 when the synchronization reference signal's rising edge is delayed by D0 is:

$$PD0_{n-1} = \frac{p(D0)}{2}\left[\text{erfc}\left(\frac{m+D0}{\sqrt{2}\sigma}\right) - \text{erfc}\left(\frac{T+D0+m}{\sqrt{2}\sigma}\right)\right] \qquad (12)$$

Where p(D0) is the probability that the synchronization reference signal's rising edge will be delayed by D0. Similar expressions can be written for some arbitrary delay Dv. A general expression can also be written for the probability that the counter value N will be latched:

$$PDv_n = p(Dv)\left\{1 - \frac{1}{2}\left[\text{erfc}\left(\frac{m+Dv}{\sqrt{2}\sigma}\right) + \text{erfc}\left(\frac{T-Dv-m}{\sqrt{2}\sigma}\right)\right]\right\} \qquad (13)$$

The phase detector's sensitivity is given by sum of the probabilities for all different delays:

$$P_n = \sum_{j=0}^{N} p(Dj) \left\{ 1 - \frac{1}{2} \left[ \text{erfc}\left(\frac{m+Dj}{\sqrt{2}\,\sigma}\right) + \text{erfc}\left(\frac{T-Dj-m}{\sqrt{2}\,\sigma}\right) \right] \right\} \quad (14)$$

$$P_{n-1} = \sum_{j=0}^{N} \frac{p(Dj)}{2} \left[ \text{erfc}\left(\frac{m+Dj}{\sqrt{2}\,\sigma}\right) - \text{erfc}\left(\frac{T+Dj+m}{\sqrt{2}\,\sigma}\right) \right] \quad (15)$$

Figure 12:
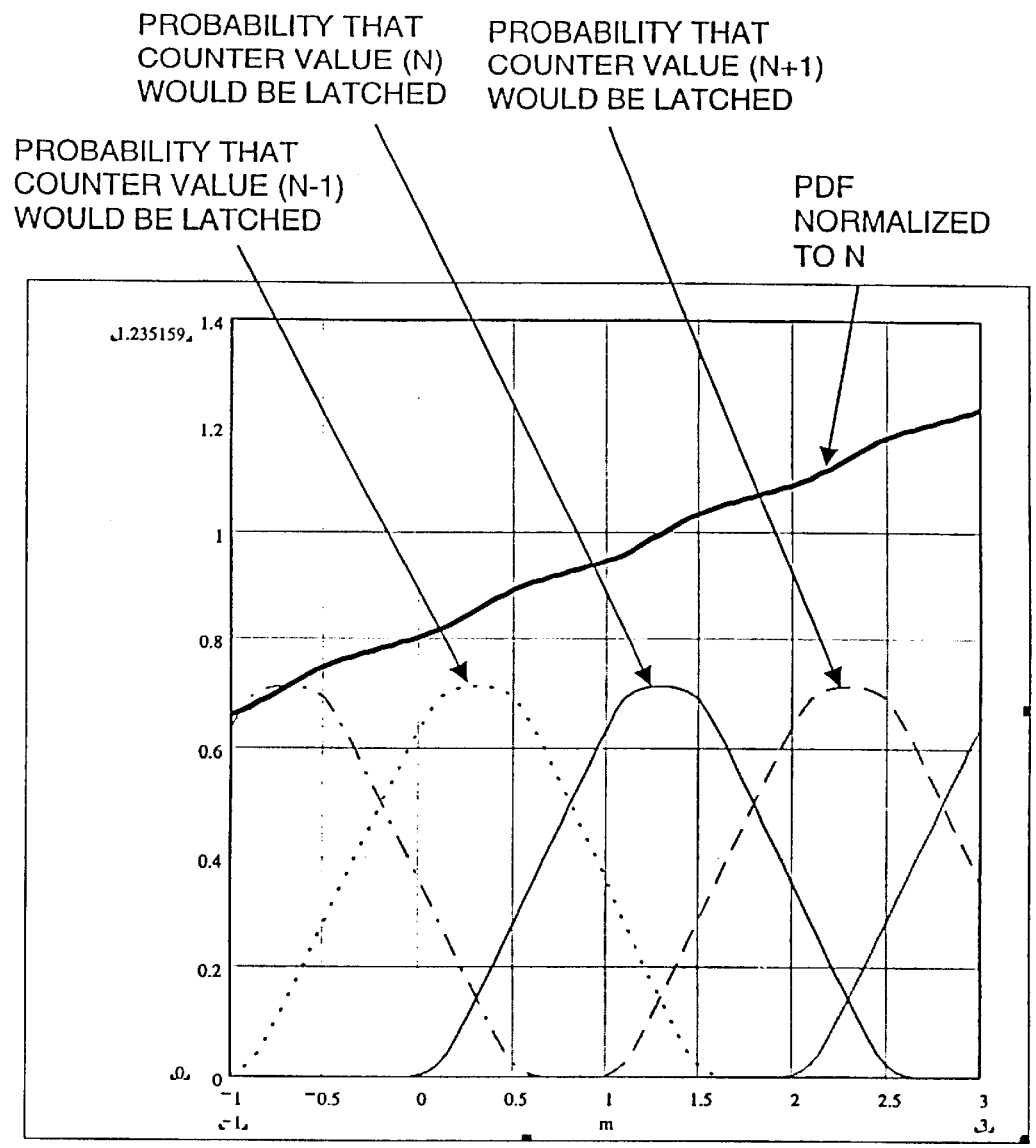
FIG. 12 is a graphical representation of phase detector transfer function vs. SNR and phase difference between VCXO clock and synchronization reference phase.

The phase detector's characteristic can then be derived using equation 11, and is graphically depicted in FIG. 12. It can clearly be seen that the dead band zone has been eliminated. Moreover, those skilled in the art will realize that if a larger number of delays are used, the PDTF can be made much smoother.

Figure 13:
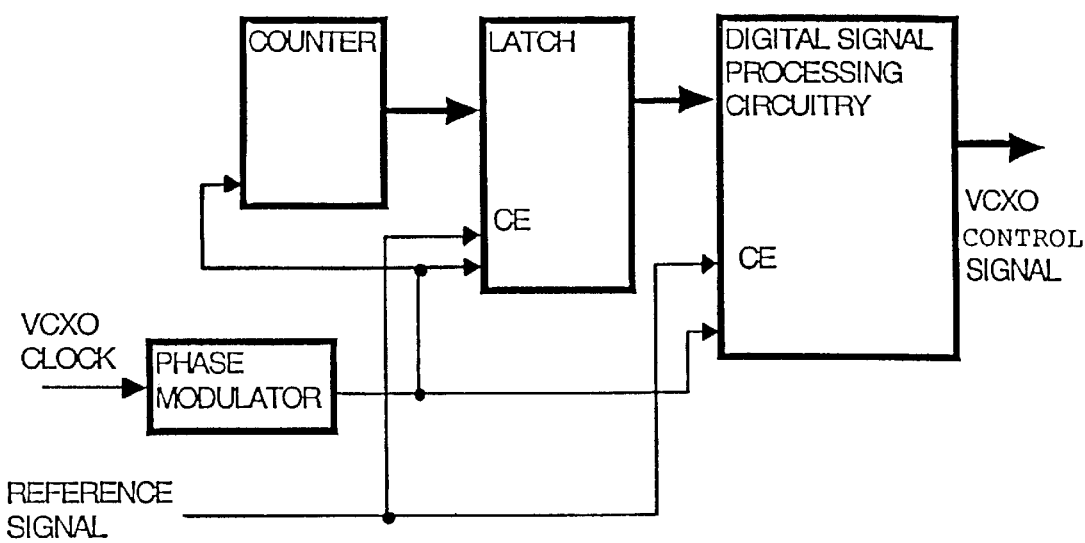
FIG. 13 is block diagram representation of a counter-based phase detector in accordance with an alternative embodiment of the present invention.

As shown in FIG. 13, the FIG. 7 phase detector can be modified by phase modulating the VCXO clock signal instead of the synchronization reference signal. As is also shown in FIG. 13, the FIG. 7 accumulator can be replaced by any digital signal processing circuitry capable of processing the latched value output by the latch.

In the foregoing description it has been assumed that the counter period (i.e. the time required for either of the counters shown in FIG. 7 or 13 to repeat its count) is synchronized to the period of the synchronization reference signal, such that N times the VCXO clock period is equal to one synchronization reference signal period. This is unnecessary. The counter period can be significantly shorter or significantly longer than the period of the synchronization reference signal. The ratio of the two periods can be any rational number, implying that the two periods do not have to be synchronized. The digital signal processing circuitry shown in FIG. 13 is required to process the latched value output by the latch if the two periods are not synchronized. The FIG. 13 phase modulator can be implemented to modulate (delay) the input signal in discrete steps or as a continuous phase delay circuit.

As will be apparent to those skilled in the art in the light of the foregoing disclosure, many alterations and modifications are possible in the practice of this invention without departing from the scope thereof. For example, the invention can be applied to charge pump based phase detectors to eliminate ambiguity in phase detector transfer function at zero phase difference. The scope of the invention is to be construed in accordance with the substance defined by the following claims.

What is claimed is:

1. A phase detector for use in a phase locked loop having a voltage controlled oscillator, said phase detector comprising:
    (a) a counter clocked by a clock signal produced by said voltage controlled oscillator;
    (b) a latch coupled to said counter and clocked by a modulated clock signal to latch values output by said counter;
    (c) a phase modulator for modulating a synchronization clock reference signal to produce said modulated clock signal; and,
    (d) an accumulator coupled to said latch and clocked by said modulated clock signal to receive and average said latch values and to produce a phase error signal representative of phase difference between said voltage controlled oscillator clock signal and said synchronization clock reference signal, said phase error signal coupled to said voltage controlled oscillator to reduce said phase difference.

2. A phase detector as defined in claim 1, wherein said phase modulator modulates a rising edge of said synchronization clock reference signal.

3. A phase detector as defined in claim 1, wherein:
    (a) said phase locked loop has a loop bandwidth; and,
    (b) said phase modulator modulates said synchronization clock reference signal with a modulation signal having modulation frequencies outside said loop bandwidth.

4. A phase detector as defined in claim 1, wherein said phase modulator modulates a rising edge of said synchronization clock reference signal with a discrete step signal having a fine time resolution, causing said latch to latch different values output by said counter in different time intervals corresponding to the time of occurrence of said modulated rising edge with respect to said respective time intervals.

5. A phase detector as defined in claim 1, wherein:
    (a) said phase modulator modulates said synchronization clock reference signal with a modulation signal; and,
    (b) said accumulator averages said latch values during an accumulation time period equal to an integer multiple of the period of said modulation signal.

6. A phase detector as defined in claim 5, wherein said phase modulator further comprises a pseudo random sequence generator for producing said modulation signal as a pseudo random signal.

7. A phase detector as defined in claim 6, wherein said modulation signal is cyclostationary with respect to said accumulation time period.

8. A method of controlling phase error in a phase locked loop having a voltage controlled oscillator, comprising:
    (a) clocking a counter with a clock signal produced by said voltage controlled oscillator;
    (b) phase modulating a synchronization clock reference signal to produce a modulated clock signal;
    (c) latching values output by said counter in a latch clocked by said modulated clock signal;
    (d) accumulating an average of said latched values to produce a phase error signal representative of phase difference between said voltage controlled oscillator clock signal and said synchronization clock reference signal; and,
    (e) coupling said phase error signal to said voltage controlled oscillator to reduce said phase difference.

9. A method as defined in claim 8, wherein said phase modulation further comprises modulating a rising edge of said synchronization clock reference signal.

10. A method as defined in claim 8, wherein said phase locked loop has a loop bandwidth, said phase modulation further comprising modulating said synchronization clock reference signal with a modulation signal having modulation frequencies outside said loop bandwidth.

11. A method as defined in claim 8, said phase modulation further comprising modulating a rising edge of said synchronization clock reference signal with a discrete step signal having a fine time resolution to cause said latch to latch different values output by said counter in different time intervals corresponding to the time of occurrence of said modulated rising edge with respect to said respective time intervals.

12. A method as defined in claim 8, wherein:
    (a) said phase modulation modulates said synchronization clock reference signal with a modulation signal; and,
    (b) said accumulating averages said latched values during an accumulation time period equal to an integer multiple of the period of said modulation signal.

13. A method as defined in claim 12, wherein said modulation signal is pseudo random.

14. A method as defined in claim 13, wherein said modulation signal is cyclostationary with respect to said accumulation time period.

\* \* \* \* \*